(12) United States Patent
Shieh

(10) Patent No.: US 7,287,207 B2
(45) Date of Patent: Oct. 23, 2007

(54) METHOD AND APPARATUS FOR COMPUTING PARITY CHARACTERS FOR A CODEWORD OF A CYCLIC CODE

(75) Inventor: Jia-Horng Shieh, Taipei Hsien (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 260 days.

(21) Appl. No.: 10/906,574

(22) Filed: Feb. 24, 2005

(65) Prior Publication Data
US 2006/0041824 A1 Feb. 23, 2006

(30) Foreign Application Priority Data
Aug. 19, 2004 (TW) .............................. 93124971 A

(51) Int. Cl.
*H03M 13/00* (2006.01)
(52) U.S. Cl. ..................................... 714/756
(58) Field of Classification Search .................. 714/756
See application file for complete search history.

(56) References Cited

U.S. PATENT DOCUMENTS

| 4,928,280 A | * | 5/1990 | Nielson et al. ............. 714/762 |
| 5,140,596 A | | 8/1992 | Weldon, Jr. ................. 714/762 |

* cited by examiner

*Primary Examiner*—Shelly Chase
(74) *Attorney, Agent, or Firm*—Winston Hsu

(57) ABSTRACT

A method for computing parity characters for a codeword of a cyclic code successively generates a sum of an output value and a respective message character of a first message section adjacent to parity characters within a first block. The method then successively multiplies a respective sum by corresponding coefficients of a generator polynomial to generate at least one product. The method further successively multiplies a respective message character of every message section other than the first message section by coefficients of a corresponding shift polynomial to generate a plurality of products, before finally, successively summing corresponding products to generate the output value.

18 Claims, 9 Drawing Sheets

METHOD AND APPARATUS FOR COMPUTING PARITY CHARACTERS FOR A CODEWORD OF A CYCLIC CODE

BACKGROUND

The present invention relates to method and apparatus for generating parity characters for a codeword of a cyclic code.

An error correction code (ECC) is widely employed to detect or to correct errors in data. In general, parity characters of an ECC are calculated based on message characters to be transmitted and appended after the message characters to form a codeword. When a receiver receives the codeword, it may be able to correct a transmission error within the received message characters according to the parity characters of the codeword. A cyclic code is a kind of ECC and is commonly used in different fields. For example, the Reed-Solomon (RS) code employed in optical storage systems is a cyclic code.

Please refer to FIG. 1, which depicts a schematic diagram of a conventional codeword 100 of a cyclic code. The codeword 100 is composed of a data block (i.e. message block) 110 and a parity section 120. The format of the codeword 100 is similar to most cyclic codewords. Generally, the data block 110 can be regarded as a message polynomial M(x), and the parity section 120 can be regarded as a parity polynomial P(x). When encoding the message characters into the codeword 100, a serial encoder is typically employed to divide the message polynomial M(x) by a generator polynomial g(x) in order to compute the parity polynomial P(x), which is the remainder of the division.

In practical implementations, however, the parity characters of some cyclic codes are not located in the end of the codeword. For example, the well-known CIRC (cross-interleaved Reed-Solomon code) employed in the CD specification adopts a (28, 24) shortened Reed-Solomon code as an outer code. A codeword composed of twenty eight characters is encoded with the shortened RS(28, 24) code over a finite field $GF(2^8)$ by calculating four parity characters based on twenty four message characters. As shown in FIG. 2, in the CD specification, the four parity characters are located in the middle of the codeword instead of the end of the codeword.

FIG. 2 is a schematic diagram of a codeword 200 encoded with the shortened RS(28, 24) code over $GF(2^8)$. The codeword 200 is employed in the CD specification. The codeword 200 is composed of a first data block 210, a second data block 230 and a parity section 220. The first data block 210 and the second data block 230 are each a part of the message characters to be transmitted. A difference between the codeword 200 and the codeword 100 is that the parity section 220 of the codeword 200 is located in the middle of the codeword instead of the end of the codeword 200. In the following, the first data block 210 to the left of the parity section 220 is designated as a polynomial L(x), the second data block 230 to the right of the parity section 220 is designated as a polynomial R(x), and the parity section 220 is designated as a parity polynomial P(x). In other words, the codeword 200 encoded with the shortened RS(28, 24) code over $GF(2^8)$ can be represented as a codeword polynomial $C(x)=L(x)x^{16}+P(x)x^{12}+R(x)$.

Since the shortened RS(28, 24) code employed in the CD specification requires that the parity characters be located in intermediate symbol locations in the codeword 200, it is not possible to encode the message characters in serial fashion using a serial encoder in accordance with shortened RS(28, 24) code. But the codeword 200 could be cyclically shifted to form another valid codeword due to the nature of the cyclic code, i.e., any shift of a codeword of a cyclic code is another codeword. Therefore, the conventional art cyclically shifts all message characters of the second data block 230, which is to the right of the parity section 220, to the left-most symbol locations, so that the parity characters are located at the end of the shifted codeword.

FIG. 3 illustrates a schematic diagram of a codeword 300, which is a shifted version of the codeword 200 of FIG. 2. As mentioned above, since the codeword 200 is a codeword of a cyclic code, the shifted codeword 300 is a valid codeword. As shown in FIG. 3, the second data block 230, which is at the right end of the codeword 200, now appear at the left end of the codeword 300 and the parity section 220 becomes the right-most portion of the codeword 300. However, as is well known in the art, a zero-value section 310, which is composed of a long string of zero-value characters, is inserted between the first data block 210 and the second data block 230 of the shifted codeword 300. In the case of the CIRC employed in the CD specification, the length of the string of zeros in the zero-value section 310 would be 227. Accordingly, the codeword 300 can be represented as a codeword polynomial $C_{CIRC}(x)=R(x)x^{243}+L(x)x^4+P(x)$. As a result, the parity characters (i.e., the coefficients of the polynomial P(x)) can be computed through the serial encoder. However, it requires 251 computing cycles to compute the parity characters.

In order to improve the computational speed in computing the parity characters, E. J. Weldon et al. disclose a high speed encoder in U.S. Pat. No. 5,140,596. In this patent, the required computing cycles are reduced to 12 in computing the parity characters of the CIRC. However, the encoding method disclosed by Weldon et al. cannot meet the need for higher encoding speed.

SUMMARY OF INVENTION

It is therefore an objective of the present invention to provide method and apparatus for generating parity characters for a codeword of a cyclic code, which are capable of further reducing the required computing cycles and providing higher encoding speed.

DETAILED DESCRIPTION

For convenient description, the shortened RS(28, 24) code of the CIRC employed in the CD specification is used as an example.

As mentioned above, the parity characters of a codeword encoded with the shortened RS(28, 24) code are located between a first data block (i.e. message block) and a second data block. In a first embodiment of the present invention, each of the first and second data blocks is divided into a plurality of message sections and each message section comprises at least one message character.

Figure 1:
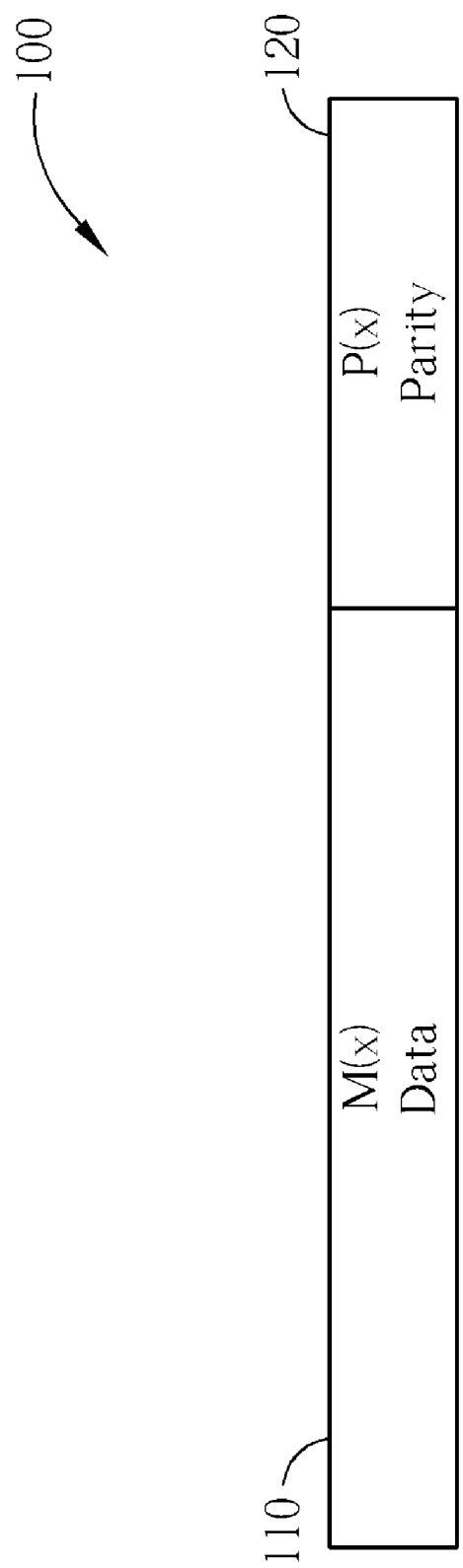
FIG. 1 is a schematic diagram of a conventional codeword of a cyclic code.
Figure 2:
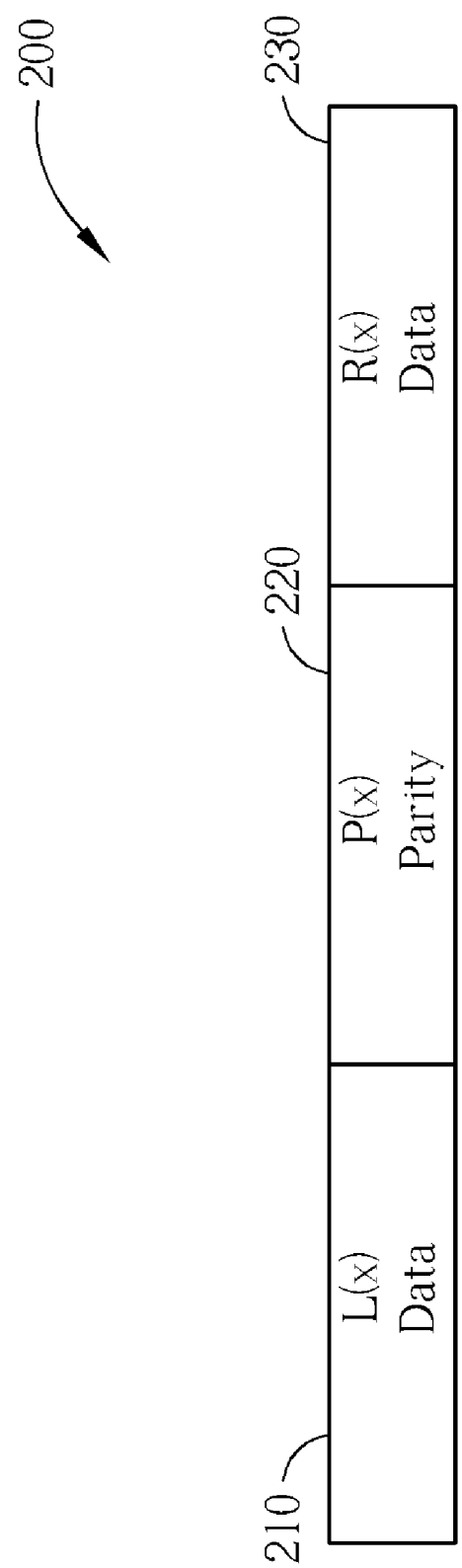
FIG. 2 is a schematic diagram of a codeword encoded with a shortened RS(28, 24) code over $GF(2^8)$ of the related art.
Figure 3:
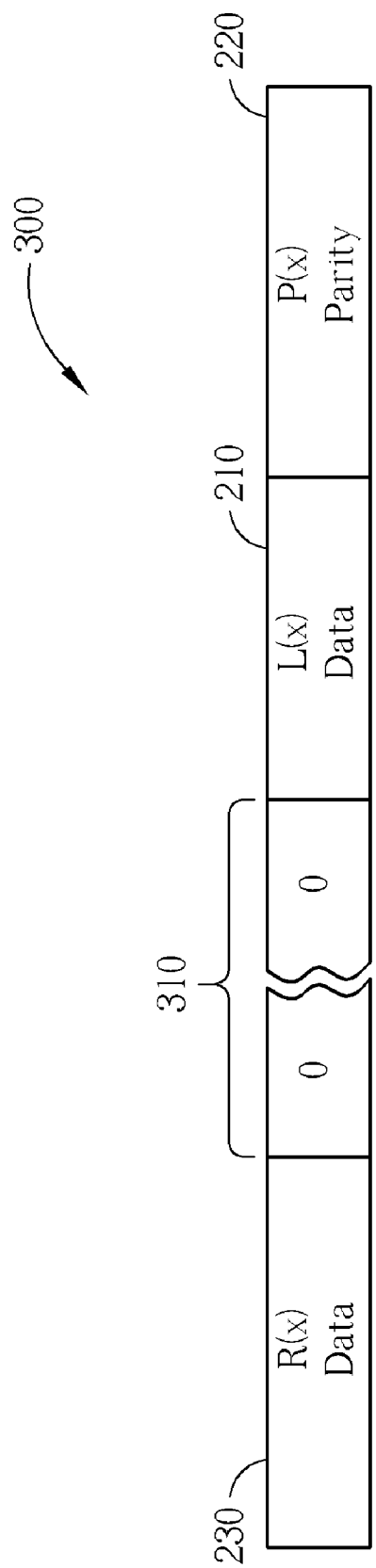
FIG. 3 is a schematic diagram of a shifted version of the codeword of FIG. 2.
Figure 4:
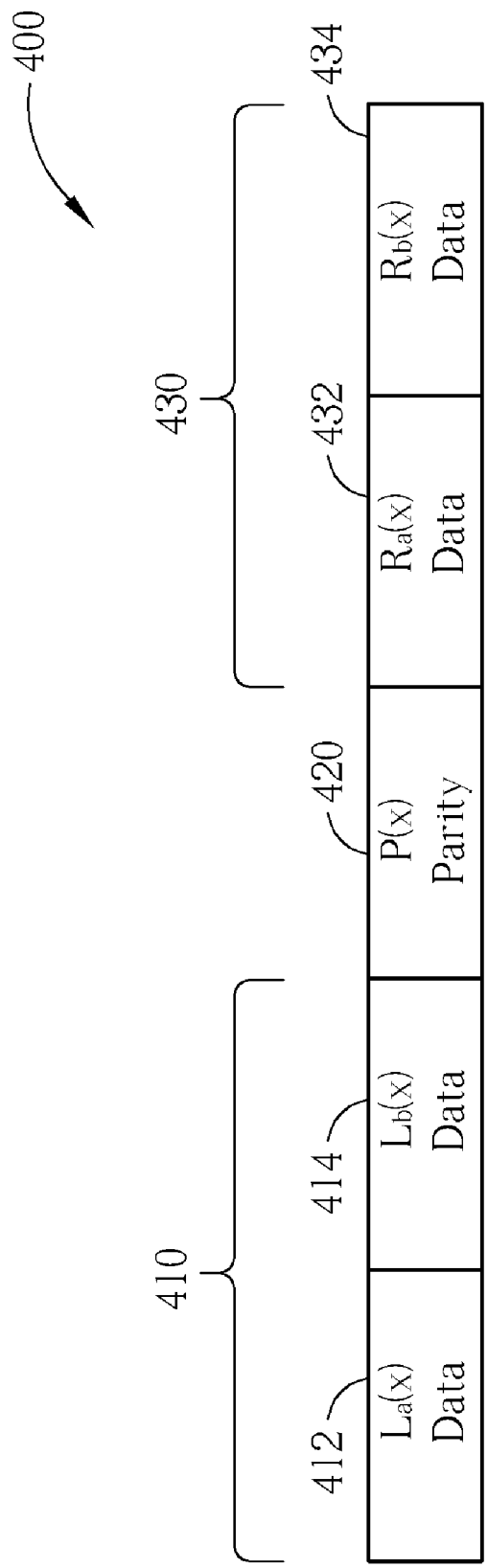
FIG. 4 is a schematic diagram of a codeword encoded with a shortened RS(28, 24) code according to one embodiment of the present invention.

Please refer to FIG. 4, which depicts a schematic diagram of a codeword 400 encoded with the shortened RS(28, 24) code according to one embodiment of the present invention. The codeword 400 comprises a first data block 410, a second data block 430 and a parity section 420. In the first embodiment of the present invention, each of the first data block 410 and the second data block 430 is divided into a plurality of message sections. For example, as shown in FIG. 4, the first data block 410 is equivalently divided into a first message section 412 and a second message section 414 while the second data block 430 is equivalently divided into a third message section 432 and a fourth message section 434. Accordingly, each message section has six message characters.

The first message section 412 can be designated as a polynomial $L_a(x)$, the second message section 414 can be designated as a polynomial $L_b(x)$, the third message section 432 can be designated as a polynomial $R_a(x)$, and the fourth message section 434 can be designated as a polynomial $R_b(x)$. The polynomials corresponding to the above message sections can be represented as follows:

$$L_a(x)=m_{23}x^5+m_{22}x^4+m_{21}x^3+m_{20}x^2+m_{19}x+m_{18} \quad (1)$$

$$L_b(x)=m_{17}x^5+m_{16}x^4+m_{15}x^3+m_{14}x^2+m_{13}x+m_{12} \quad (2)$$

$$R_a(x)=m_{11}x^5+m_{10}x^4+m_9x^3+m_8x^2+m_7x^1+m_6 \quad (3)$$

$$R_b(x)=m_5x^5+m_4x^4+m_3x^3+m_2x^2+m_1x+m_0 \quad (4)$$

wherein the coefficient $m_i$ of a respective polynomial corresponds to a respective message character of the corresponding message section. In addition, the parity section 420 can be designated as a parity polynomial P(x), which can be represented as follows:

$$P(x)=p_3x^3+p_2x^2+p_1x+p_0 \quad (5)$$

In the case of the shortened RS(28, 24) code employed in the CD specification, a generator polynomial g(x) in $GF(2^8)$ can be represented as follows:

$$g(x)=(x+\alpha^0)(x+\alpha^1)(x+\alpha^2)(x+\alpha^3)=x^4+\alpha^{75}x^3+\alpha^{249}x^2+\alpha^{78}x+\alpha^6 \quad (6)$$

Figure 5:
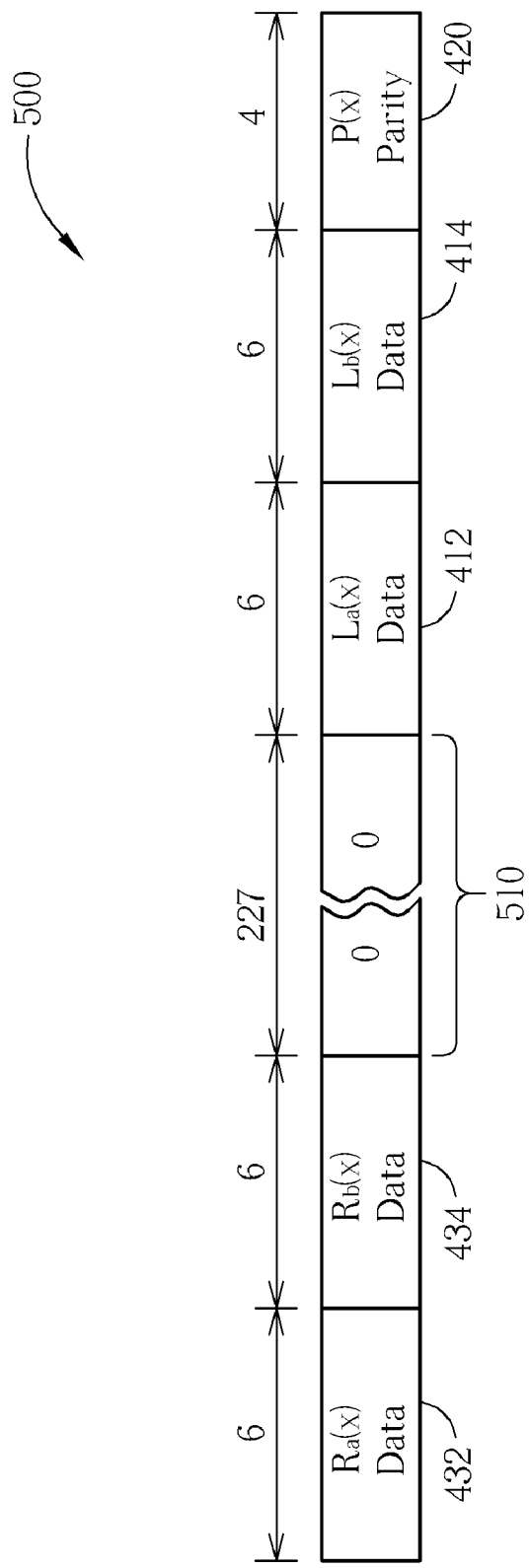
FIG. 5 is a schematic diagram of a shifted version of the codeword of FIG. 4.

FIG. 5 depicts a schematic diagram of a codeword 500, which is a shifted version of the codeword 400 of FIG. 4. Similarly, when the third message section 432 and the fourth message section 434 of the codeword 400 are cyclically shifted to the left-most part of the codeword, a zero-value section 510 composed of a long string of 227 zero-value characters is inserted between the fourth message section 434 and the first message section 412. As mentioned above, the codeword 500 is also a valid codeword and can be designated as a codeword polynomial $C_{CIRC}(X)$, which can be represented as follows:

$$C_{CIRC}(x)=R_a(x)x^{249}+R_b(x)x^{243}+L_a(x)x^{10}+L_b(x)x^4+p(x) \quad (7)$$

According to equations (5), (6) and (7), the computation of the parity polynomial P(x) can be expressed as follows:

$$P(x)=\text{remainder}\{(R_a(x)x^{249}+R_b(x)x^{243}+L_a(x)x^{10}+L_b(x)x^4)/g(x)\} \quad (8)$$

In order to reduce the complexity of circuitry for computing the coefficients of the parity polynomial P(x), the equation (8) is modified as described in the following.

In a preferred embodiment of the present invention, an $x^n$ term of equation (7) is regarded as a shift factor of the corresponding polynomial. For example, $x^{249}$ is taken as the shift factor corresponding to the polynomial $R_a(x)$, $x^{243}$ is taken as the shift factor corresponding to the polynomial $R_b(x)$, and $x^{10}$ is taken as the shift factor corresponding to the polynomial $L_a(x)$. For reducing the required computations, in the first embodiment of the present invention, the shift factors of all message sections other than the second message section 414, which is located to the left of the parity section 420 and is adjacent to the parity section 420, are divided by the generator polynomial g(x), respectively. That is, the shift factors of the message sections 432, 434 and 412 are divided by the generator polynomial g(x), respectively. Then, each of the remainders of the divisions is used as a shift polynomial of the corresponding polynomial and is established in the equation (8). Further details are described as follows:

First, let $h_1(x)$ be the shift polynomial corresponding to the polynomial $R_a(x)$, let $h_2(x)$ be the shift polynomial corresponding to the polynomial $R_b(x)$, and let $h_3(x)$ be the shift polynomial corresponding to the polynomial $L_a(x)$. In the first embodiment of the present invention, the computation of $h_1(x)$, $h_2(x)$ and $h_3(x)$ can be expressed as follows:

$$h_1(x)=\text{remainder}\{x^{249}/g(x)\}=\alpha^{116}+\alpha^{136}x+\alpha^{47}x^2+\alpha^{184}x^3 \quad (9)$$

$$h_2(x)=\text{remainder}\{x^{243}/g(x)\}=\alpha^{22+\alpha246}x+\alpha^{120}x^2+\alpha^{113}x^3 \quad (10)$$

$$h_3(x)=\text{remainder}\{x^{10}/g(x)\}=\alpha^{140}+\alpha^{236}x+\alpha^{154}x^2+\alpha^{43}x^3 \quad (11)$$

Next, the equations (9), (10) and (11) are incorporated into the equation (8), and equation (8) becomes:

$$P(x)=\text{remainder}\{(R_a(x)h_1(x)+R_b(x)h_2(x)+L_a(x)h_3(x)+L_b(x)x^4)/g(x)\} \quad (12)$$

Figure 6:
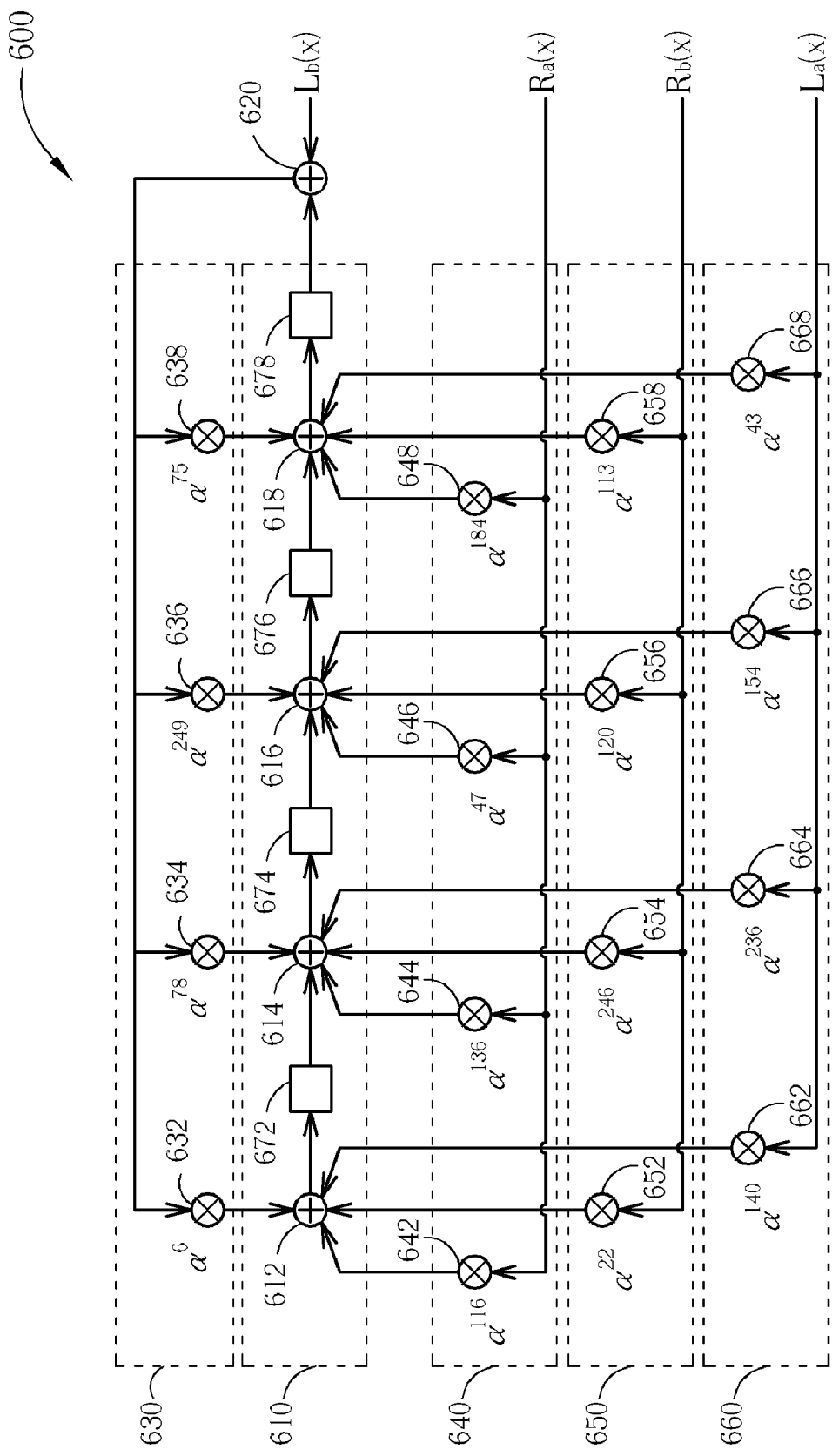
FIG. 6 is a schematic diagram of a parity computing apparatus according to a first embodiment of the present invention.

An exemplary circuitry for computing equation (12) is described in the following. Please refer to FIG. 6, which illustrates a schematic diagram of a parity computing apparatus 600 according to a first embodiment of the present invention. As shown in FIG. 6, the parity computing apparatus 600 comprises an adder module 610, a first adder 620, a first multiplier module 630, a second multiplier module 640, a third multiplier module 650, and a fourth multiplier module 660. The adder module 610 comprises four cascaded adders 612, 614, 616, 618 and four remainder registers 672, 674, 676 and 678. Each of the multiplier modules comprises four multipliers. As shown, one of the multipliers of each multiplier module is electrically connected to a corresponding adder of the adder module 610. One of the adders of the adder module 610 sums values received from the connected multipliers and passes the sum to a corresponding register. In practical implementations, the first adder 620 or each adder of the adder module 610 could be implemented with an exclusive OR gate.

In this embodiment, the first adder 620 of the parity computing apparatus 600 is used for successively generating a sum of one of message characters of the second message section 414 adjacent to the parity section 420 within the first data block 410 (i.e. one of the coefficients of the polynomial $L_b(x)$) and an output value from the register 678. Each of the four multipliers 632, 634, 636 and 638 of the first multiplier module 630 is used for successively multiplying one of sums output from the first adder 620 by corresponding coefficients of the generator polynomial g(x). Each of the four multipliers 642, 644, 646 and 648 of the second multiplier module 640 is used for successively multiplying one of the coefficients of the polynomial $R_a(x)$ by corresponding coefficients of the shift polynomial $h_1(x)$. Each of the four multipliers 652, 654, 656 and 658 of the second multiplier module 650 is used for successively multiplying one of the coefficients of the polynomial $R_b(x)$ by corresponding coefficients of the shift polynomial $h_2(x)$. In addition, each of the four multipliers 662, 664, 666 and 668 of the second multiplier module 660 is used for successively multiplying one of the coefficients of the polynomial $L_a(x)$ by corresponding coefficients of the shift polynomial $h_3(x)$.

As mentioned above, each of the four registers 672, 674, 676 and 678 of the adder module 610 is used for temporarily storing the sum output from the corresponding adder and for synchronously passing the stored value to the next stage adder. After the polynomials corresponding to the message sections of the codeword 500 are respectively processed by the corresponding multiplier module, the values stored in the four registers of the adder module 610 are the coefficients of the parity polynomial P(x). In the parity computing apparatus 600 shown in FIG. 6, the final value stored in the register 672 is the coefficient $p_0$ of the parity polynomial P(x), the final value stored in the register 674 is the coefficient $p_1$, the final value stored in the register 676 is the coefficient $p_2$, and the final value stored in the register 678 is the coefficient $p_3$.

In the illustrated embodiment, each message section has six message characters, so that the parity computing apparatus 600 used for computing the equation (12), which is derived from the equation (8), requires only six computing cycles to calculate all the parity characters of the codeword 500. In contrast to the encoder disclosed in U.S. Pat. No. 5,140,596, the parity computing apparatus 600 shown in FIG. 6 has double the computing speed.

Note that each of the first data block 410 and the second data block 430 of the codeword 400 being equivalently divided into two message sections is only for the purpose of convenience of illustration and not intended to limit the application scope of the present invention. In practice, each of the data blocks on both sides of the parity section 420 could be divided equivalently into three or more message sections. In addition, one data block being equivalently divided into two or more message sections while the other data block is not so divided is also allowed in other implementations. Using the codeword 400 of the shortened RS(28, 24) code employed in the CD specification as an example, each of the data blocks on both sides of the parity section 420 has twelve message characters as shown in FIG. 4. Thus, in this embodiment, each of the data blocks could be equivalently divided into twelve message sections at most. In other word, each message section has only one message character. In this way, the required time for computing the coefficients of the parity polynomial P(x) can be significantly reduced to only one computing cycle by calculating the respective shift polynomials of the message sections using the above manner and by increasing the amount of multiplier modules employed in the parity computing apparatus.

In addition, both the amount of adders employed in the adder module and the amount of multipliers employed in the respective multiplier module are adjustable with the parity length and not limited to four. For example, if the number of parity characters is two instead of four, only two adders are required for the adder module and only two multipliers are required for each of the multiplier modules.

Furthermore, in the present invention, the numbers of message characters of respective data blocks on both sides of the parity characters are not limited to be the same. For example, supposing that the data block to the left of the parity section of a codeword has eleven message characters while the data block to the right of the parity section has eight message characters, then the data block to the right of the parity section could be equivalently divided into two message sections, i.e., each message section has four message characters. On the other hand, the data block to the left of the parity section could also be equivalently divided into three message sections, each having four message characters, through adding a zero into the message section having only three message characters. As a result, each message section would have the same amount of message characters so that the foregoing method for computing parity characters can be applied with only 4 cycles operation.

As mentioned above, a cyclically shifted codeword of a cyclic code is still a valid codeword. Accordingly, the method and apparatus for computing parity characters of the present invention can reverse the codeword first and then compute the parity characters. For convenient description, the shortened RS(28, 24) code is again used as an example to illustrate a second embodiment of the present invention in the following.

Figure 7:
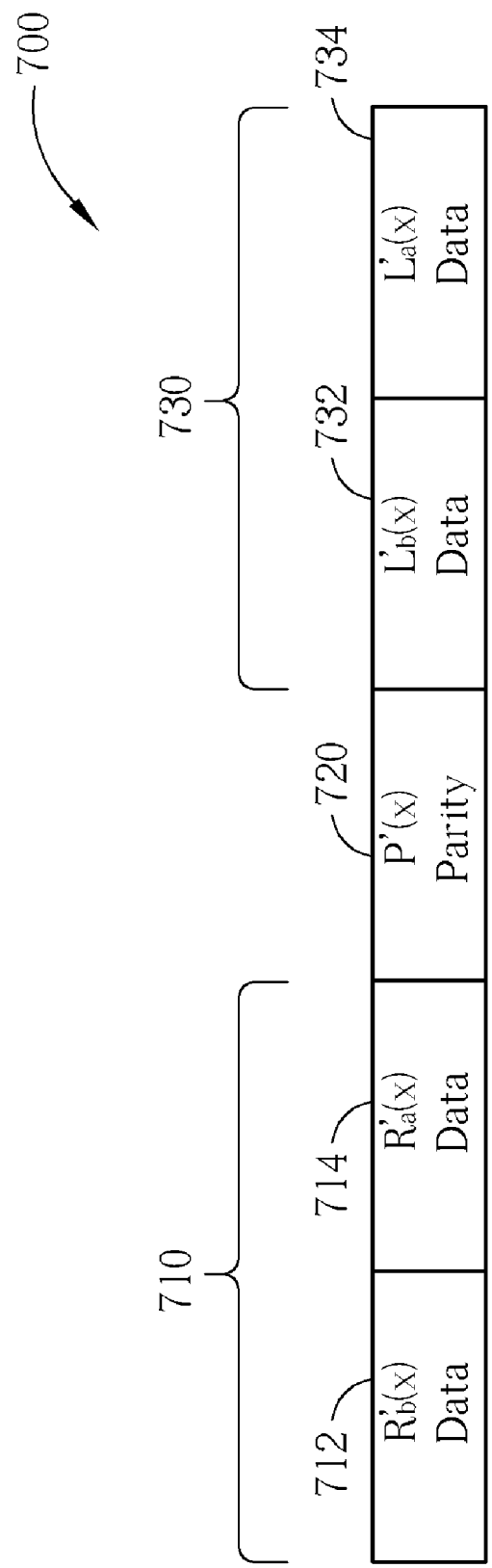
FIG. 7 is a schematic diagram of a reversed version of the codeword of FIG. 4.

Please refer to FIG. 7 as well as FIG. 4. FIG. 7 depicts a schematic diagram of a codeword 700, which is a reversed version of the codeword 400 of FIG. 4. Similarly, the codeword 700 comprises a first data block 710, a second data block 730 and a parity section 720. However, since the codeword 700 is the reverse of the codeword 400 of FIG. 4, the character order of the first data block 710 is opposite the character order of the second data block 430 while the character order of the second data block 730 is opposite the character order of the first data block 410.

A first message section 712 can be designated as a polynomial $R'_b(x)$, a second message section 714 can be designated as a polynomial $R'_a(x)$, a third message section 732 can be designated as a polynomial $L'_b(x)$, and a fourth message section 734 can be designated as a polynomial $L'_a(x)$. As shown, each message section has six message characters. The above four polynomials can be represented as follows:

$$R'_b(x) = m_0 x^5 + m_1 x^4 + m_2 x^3 + m_3 x^2 + m_4 x + m_5 \tag{13}$$

$$R'_a(x) = m_6 x^5 + m_7 x^4 + m_8 x^3 + m_9 x^2 + m_{10} x + m_{11} \tag{14}$$

$$L'_b(x) = m_{12} x^5 + m_{13} x^4 + m_{14} x^3 + m_{15} x^2 + m_{16} x + m_{17} \tag{15}$$

$$L'_a(x) = m_{18} x^5 + m_{19} x^4 + m_{20} x^3 + m_{21} x^2 + m_{22} x + m_{23} \tag{16}$$

Similarly, a parity polynomial P'(x) corresponding to the parity section 720 of the codeword 700 can be represented as follows:

$$P'(x) = p_0 x^3 + p_1 x^2 + p_2 x + p_3 \tag{17}$$

Additionally, a reverse generator polynomial g'(x) corresponding to the generator polynomial g(x) can be represented as:

$$g'(x) = (x + \alpha^0)(x + \alpha^{-1})(x + \alpha^{-2})(x + \alpha^{-3}) = x^4 + \alpha^{72} x^3 + \alpha^{243} x^2 \alpha^{69} x + \alpha^{249} \tag{18}$$

Figure 8:
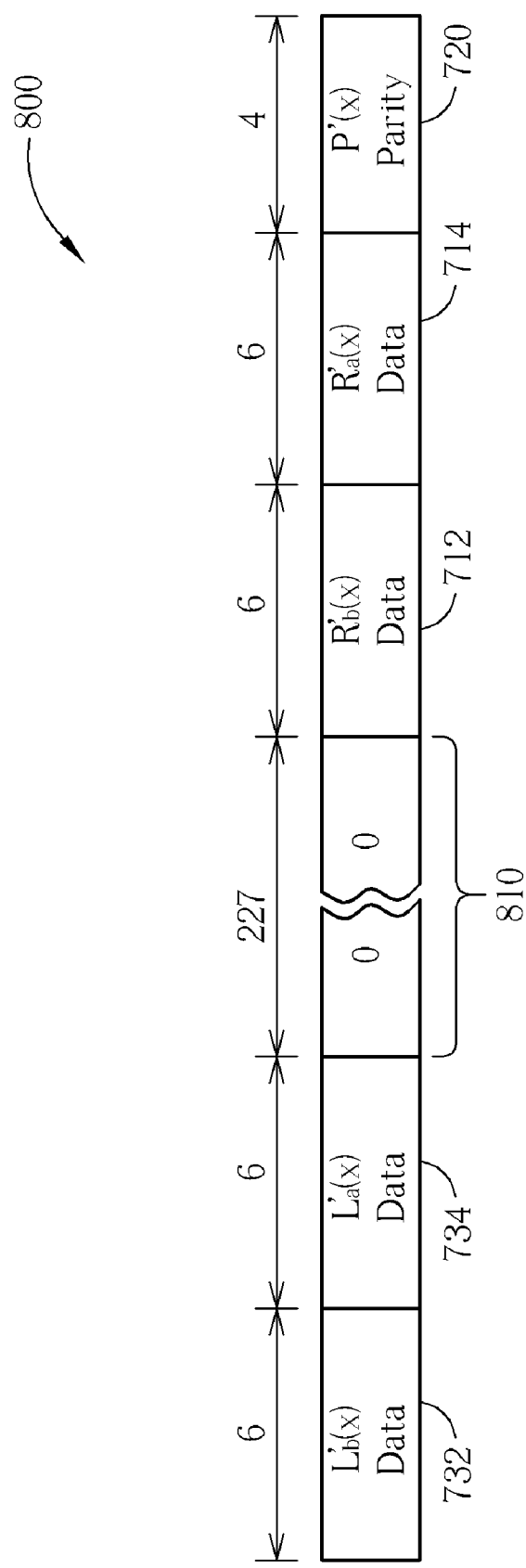
FIG. 8 is a schematic diagram of a shifted version of the codeword of FIG. 7.

FIG. 8 illustrates a schematic diagram of a codeword 800 representing a shifted version of the codeword 700 of FIG. 7. Similarly, a zero-value section 810 composed of a long string of 227 zero-value characters is inserted between the fourth message section 734 and the first message section 712. As mentioned above, the codeword 800 is also a valid codeword and can be designated as a codeword polynomial $C'_{CIRC}(x)$, which can be represented as:

$$C'_{CIRC}(x) = L'_b(x)x^{249} + L'_a(x)x^{243} + R'_b(x)x^{10} + R'_a(x)x^4 + P'(x) \quad (19)$$

According to the equations (17), (18) and (19), the calculation of the reversed parity polynomial P'(x) can be expressed as:

$$P'(x) = \text{remainder}\{(L'_b(x)x^{249} + L'_a(x)x^{243} + R'_b(x)x^{10} + R'_a(x)x^4)/g(x)\} \quad (20)$$

Similarly, in this embodiment, the shift factors of all message sections located to the left of the parity section 720, i.e., message sections 732, 734 and 712, are divided by the reverse generator polynomial g'(x), respectively, in order to reduce computing cycles. Afterward, each of the remainders of these divisions is used as a shift polynomial of the corresponding polynomial and is incorporated into the equation (20). Further details are described as follows:

First, let $h'_1(x)$ be the shift polynomial corresponding to the polynomial $L'_b(x)$, let $h'_2(x)$ be the shift polynomial corresponding to the polynomial $L'_a(x)$, and let $h'_3(x)$ be the shift polynomial corresponding to the polynomial $R'_b(x)$. In the second embodiment of the present invention, computation of $h'_1(x)$, $h'_2(x)$ and $h'_3(x)$ can be expressed as follows:

$$h'_1(x) = \text{remainder}\{x^{249}/g'(x)\} = \alpha^{134} + \alpha^{157}x + \alpha^{71}x^2 + \alpha^{211}x^3 \quad (21)$$

$$h'_2(x) = \text{remainder}\{x^{243}/g'(x)\} = \alpha^{58} + \alpha^{30}x + \alpha^{162}x^2 + \alpha^{158}x^3 \quad (22)$$

$$h'_3(x) = \text{remainder}\{x^{10}/g'(x)\} = \alpha^{110} + \alpha^{209}x + \alpha^{130}x^2 + \alpha^{22}x^3 \quad (23)$$

Next, the equations (21), (22) and (23) are incorporated into the equation (20), so that the equation (20) becomes:

$$P'(x) = \text{remainder}\{(L'_b(x)h'_1(x) + L'_a(x)h'_2(x) + R'_b(x)h'_3(x) + R'_a(x)x^4)/g'(x)\} \quad (24)$$

Figure 9:
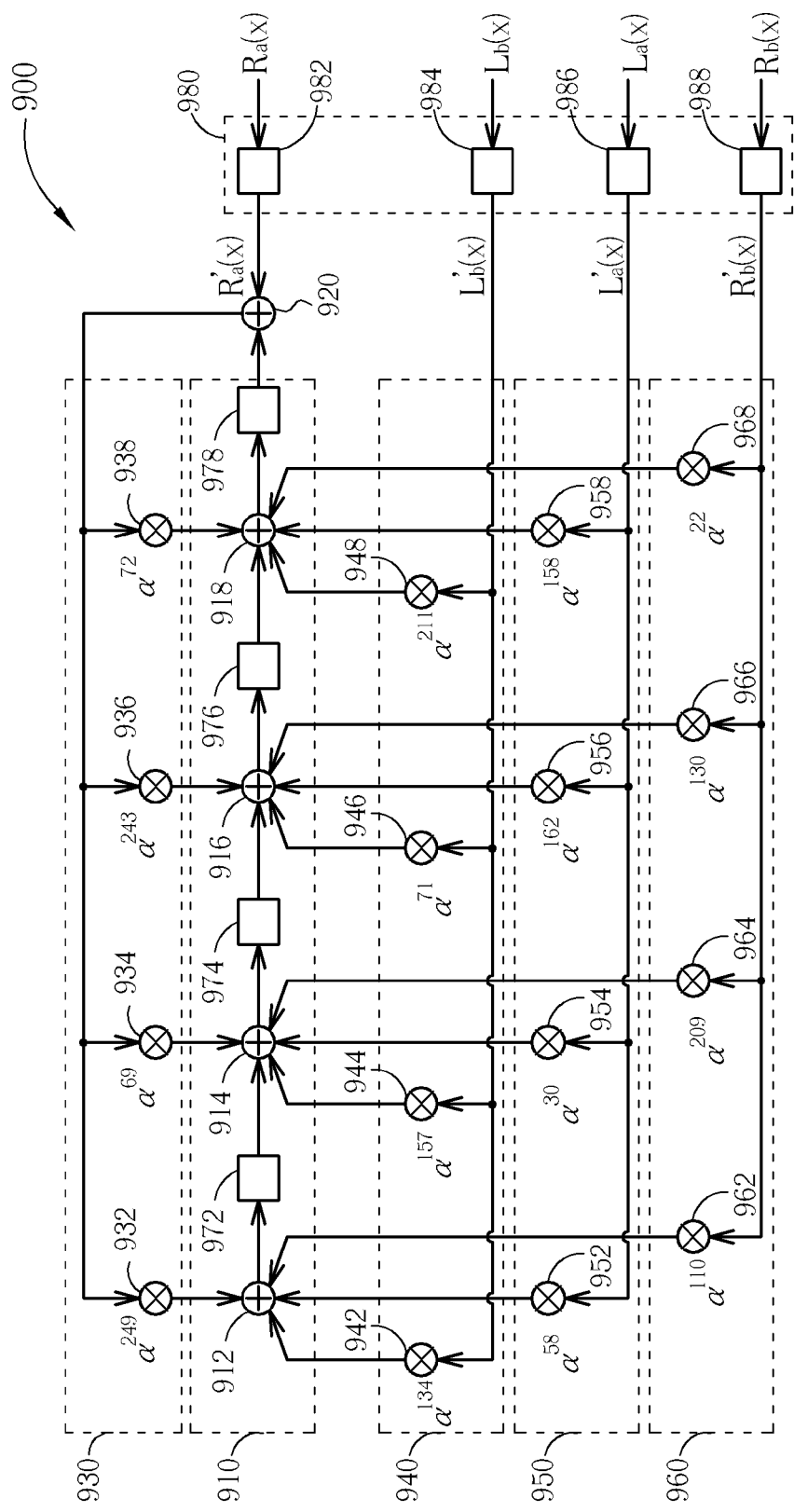
FIG. 9 is a schematic diagram of a parity computing apparatus according to a second embodiment of the present invention.

FIG. 9 depicts a schematic diagram of a parity computing apparatus 900 according to a second embodiment of the present invention. Similar to the parity computing apparatus 600 shown in FIG. 6, the parity computing apparatus 900 comprises an adder module 910, a first adder 920, a first multiplier module 930, a second multiplier module 940, a third multiplier module 950, and a fourth multiplier module 960. In addition, the parity computing apparatus 900 further comprises a reverse module 980. As shown in FIG. 9, the reverse module 980 comprises four reverse units 982, 984, 986 and 988. The four reverse units are used for reversing the message sections of the codeword 400 into the message sections of the codeword 700, respectively. In practice, each reverse unit can be implemented with a first-in-last-out (FILO) device.

In the parity computing apparatus 900, the adder module 910 comprises four cascaded adders 912, 914, 916, 918 and four remainder registers 972, 974, 976, 978. Each of the multiplier modules comprises four multipliers. As shown, one of the multipliers of each multiplier module is electrically connected to a corresponding adder of the adder module 910. One of the adders of the adder module 910 sum up values received from corresponding multipliers and passes the sum to a corresponding register. In practical implementations, the first adder 920 or each adder of the adder module 910 can be implemented with an exclusive OR gate (XOR).

In this embodiment, the operations of the first adder 920 and the adder module 910 are substantially the same as the first adder 620 and the adder module 610 of the parity computing apparatus 600 shown in FIG. 6. The operations of the multiplier modules of the parity computing apparatus 900 are substantially the same as the multiplier modules of the parity computing apparatus 600, except the coefficients of respective multipliers are different.

Note that the final value stored in the register 972 is the coefficient $p_3$ of the reversed parity polynomial P'(x), the final value stored in the register 974 is the coefficient $p_2$, the final value stored in the register 976 is the coefficient $p_1$, and the final value stored in the register 978 is the coefficient $p_0$. In other words, the order of the coefficients stored in the registers is opposite the order in the parity computing apparatus 600.

In contrast to the related art, the present invention has a simple circuitry architecture and much higher computing speed.

What is claimed is:

1. An apparatus for computing a parity character for a codeword of a cyclic code, the parity character having intermediate locations between a first block and a second block of the codeword, the first block or the second block comprising a plurality of message sections and each message section comprising at least one message character, the apparatus comprising:

an adder unit;

a first adder coupled to the adder unit, for successively generating a sum of an output value from the adder unit and a respective message character of a first message section adjacent to the parity characters within the first block;

a first multiplier coupled to the first adder, for successively multiplying a respective sum from the first adder by a corresponding coefficient of a generator polynomial to generate a first product; and a plurality of second multipliers for generating a plurality of second products, the second multipliers being coupled to the adder unit, for successively multiplying a respective message character of every message section other than the first message section by a coefficient of a corresponding shift polynomial to generate the second products;

wherein the adder unit successively sums corresponding products obtained from the first multiplier and from the second multipliers.

2. The apparatus of claim 1, wherein the cyclic code is a cross-interleaved Reed-Solomon code (CIRC).

3. The apparatus of claim 1, wherein each message section has the same amount of message characters.

4. The apparatus of claim 1, wherein the first block and the second block have the same amount of message sections.

5. An error correction coding method for generating parity characters for correcting an error of a transmitted codeword of a cyclic code, the parity characters having intermediate locations between a first block and a second block of the codeword, the first block or the second block comprising a plurality of message sections and each message section comprising at least one message character, the method comprising:

(a) successively generating a sum of an output value and a respective message character of a first message section adjacent to the parity characters within the first block;

(b) successively multiplying a respective sum obtained in step (a) by corresponding coefficients of a generator polynomial to generate at least one product;

(c) successively multiplying a respective message character of every message section other than the first message section by coefficients of a corresponding shift polynomial to generate a plurality of products; and (d) successively summing corresponding products obtained in step (b) and step (c) to generate an output value corresponding to the parity characters.

6. The method of claim 5, wherein the cyclic code is a cross-interleaved Reed-Solomon code (CIRC).

7. The method of claim 5, wherein each message section has the same amount of message characters.

8. The method of claim 5, wherein the first block and the second block have the same amount of message sections.

9. The method of claim 5, further comprising correcting the error of the transmitted codeword at a receiver according to the parity characters.

10. An apparatus for computing a parity character for a codeword of a cyclic code, the parity character having intermediate locations between a first block and a second block of the codeword, the first block or the second block comprising at least one message section and each message section comprising at least one message character, the apparatus comprising:

a reverse module for reversing the message characters of respective message sections to generate corresponding reversed message sections;

an adder unit;

a first adder coupled to the adder unit for successively generating a sum of an output value from the adder unit and a respective message character of a reversed message section corresponding to a second message section adjacent to the parity characters within the second block;

a first multiplier coupled to the first adder, for successively multiplying a respective sum obtained by the first adder by a corresponding coefficient of a reverse generator polynomial to generate a first product; and a second multiplier for generating a second product the second multiplier being coupled to the adder unit, for successively multiplying a respective message character of every reversed message section other than the reversed message section corresponding to the second message section by a coefficient of a corresponding shift polynomial to generate the second product;

wherein the adder unit successively sums corresponding products obtained by the first multiplier and by the second multiplier.

11. The apparatus of claim 10, wherein the cyclic code is a cross-interleaved Reed-Solomon code (CIRC).

12. The apparatus of claim 10, wherein each message section has the same amount of message characters.

13. The apparatus of claim 10, wherein the first block and the second block have the same amount of message sections.

14. An error correction coding method for generating parity characters for correcting an error of a transmitted codeword of a cyclic code, the parity characters having intermediate locations between a first block and a second block of the codeword, the first block or the second block comprising at least one message section and each message section comprising at least one message character, the method comprising:

(a) reversing the message characters of respective message sections to generate corresponding reversed message sections;

(b) successively generating a sum of an output value and a respective message character of a reversed message section corresponding to a second message section adjacent to the parity characters within the second block;

(c) successively multiplying a respective sum obtained in step (b) by corresponding coefficients of a reverse generator polynomial to generate at least one product;

(d) successively multiplying a respective message character of every reversed message section other than the reversed message section corresponding to the second message section by coefficients of a corresponding shift polynomial to generate a plurality of products; and (e) successively summing corresponding products obtained in step (c) and step (d) to generate an output value corresponding to the parity characters.

15. The method of claim 14, wherein the cyclic code is a cross-interleaved Reed-Solomon code (CIRC).

16. The method of claim 14, wherein each reversed message section has the same amount of message characters.

17. The method of claim 14, wherein the first block and the second block have the same amount of message sections.

18. The method of claim 14, further comprising correcting the error of the transmitted codeword at a receiver according to the parity characters.

* * * * *